United States Patent [19]

Chern

[11] Patent Number: 5,039,877
[45] Date of Patent: Aug. 13, 1991

[54] LOW CURRENT SUBSTRATE BIAS GENERATOR

[75] Inventor: Wen-Foo Chern, Boise, Id.

[73] Assignee: Micron Technology, Inc., Boise, Id.

[21] Appl. No.: 575,151

[22] Filed: Aug. 30, 1990

[51] Int. Cl.$^5$ .................. H03L 1/00; H03K 3/354
[52] U.S. Cl. ...................... 307/296.2; 307/303; 307/482.1
[58] Field of Search .......... 323/284; 307/296.2, 307/491, 350, 264, 296.1, 482.1, 303

[56] References Cited

U.S. PATENT DOCUMENTS

| | | | |
|---|---|---|---|
| 4,471,290 | 9/1984 | Yamaguchi | 307/296.2 |
| 4,670,668 | 6/1987 | Liu | 307/296.2 |
| 4,794,278 | 12/1988 | Vajdic | 307/296.2 |
| 4,843,256 | 6/1989 | Scade et al. | 307/296.2 |
| 4,964,082 | 10/1990 | Sato et al. | 307/296.2 |

FOREIGN PATENT DOCUMENTS 0065467 4/1984 Japan ..................... 307/296.2

OTHER PUBLICATIONS

*IBM Technical Disclosure Bulletin*, "Substrate Voltage Regular" by Cassidy and Rudelis., vol. 27, No. 2, 7/84, p. 1137.

*Primary Examiner*—Stanley D. Miller
*Assistant Examiner*—Toan Tran
*Attorney, Agent, or Firm*—Marger, Johnson, McCollom & Stolowitz, Inc.

[57] ABSTRACT

A low current substrate bias generator for regulating the voltage of a substrate layer of an integrated circuit includes a sense circuit having an input for sensing the voltage of the substrate and an output that is coupled to an inverter for providing a control signal. The control signal controls a charge pump that is coupled to the substrate layer or well that is desired to be regulated. The sense circuit includes a load element and a level shifting circuit having a predetermined standing current requirement that flows directly into the substrate. The current requirement of the bias generator is reduced by increasing the value of the load element and a reasonable delay time is maintained by coupling a capacitor across the level shifting circuit. Since the voltage across the capacitor cannot be changed instantaneously, changes in the substrate voltage are directly coupled from the input to the output of the sense circuit, triggering the charge pump. Regulation of the substrate voltage level proceeds with no corresponding increase in delay time.

20 Claims, 2 Drawing Sheets

LOW CURRENT SUBSTRATE BIAS GENERATOR

BACKGROUND OF THE INVENTION

This invention relates generally to bias generator circuits for generating a bias voltage for a semiconductor substrate layer of an integrated circuit, and more particularly to a circuit and method for reducing the amount of standing current required by the bias generator.

A technique for improving the performance of an integrated circuit formed on a substrate such as a memory device is to provide a separate bias voltage to the substrate instead of coupling the substrate to the five volt power supply ($V_{DD}$) or ground, as appropriate. The value of the bias voltage is negative for P-type substrates or wells and is greater than $V_{DD}$ for N-type substrates or wells. The substrate bias voltage is typically generated with an on-chip circuit containing a charge pump. When the substrate or well voltage changes from a nominal value due to a change in the operating condition of the integrated circuit, a sense circuit provides a control voltage to turn on the charge pump. In turn, the charge pump pumps charge into or out of the substrate until the substrate or well voltage returns to the nominal value. The sense circuit then provides a control voltage to turn off the charge pump.

Prior art bias generator circuits draw a significant standing current that flows directly into the substrate. This standing current directly and indirectly increases the power requirements of the bias generator circuit. In the case of a P-type substrate or well, the additional current raises the substrate voltage. Therefore, the charge pump must be turned on more frequently to maintain a nominal substrate voltage. Since the charge pump is typically only 25-35% efficient, an additional 1 $\mu$A of current flowing in the sense circuit translates to an additional 3-4 $\mu$A of current that must be consumed by the charge pump. Typically, 5 $\mu$A of current is required by the sense circuit to maintain a reasonably short delay time to respond to changes in the substrate voltage. Thus, a total of 20-25 $\mu$A of additional standby current is consumed by the bias generator circuit.

One simple way to reduce the current requirements of the bias generator circuit is to decrease the current flowing through the sense circuit. Such a decrease in current, however, produces a corresponding undesirable increase in the delay time in response to changes in the substrate voltage. Thus, the accuracy of the regulated substrate voltage decreases resulting in decreased performance and, possibly, latch-up of the integrated circuit.

What is desired is a bias generator circuit for regulating the voltage of a substrate on an integrated circuit having a low standing current requirement yet maintaining a reasonable delay time in responding to changes in the substrate voltage.

SUMMARY OF THE INVENTION

The present invention is a low current substrate bias generator for regulating the voltage of a substrate layer of an integrated circuit. The bias generator includes a sense circuit having an input for sensing the voltage of the substrate and an output that is coupled to an inverter for providing a control signal. The control signal controls a charge pump that is coupled to the substrate layer or well that is desired to be regulated. The sense circuit includes a load element and a level shifting circuit having a predetermined standing current requirement that flows directly into the substrate. The current requirement of the bias generator is reduced by increasing the value of the load element and a reasonable delay time is maintained by coupling a capacitor across the level shifting circuit. Since the voltage across the capacitor cannot be changed instantaneously, changes in the substrate voltage are directly coupled from the input to the output of the sense circuit, triggering the charge pump. Regulation of the substrate voltage level proceeds with no corresponding increase in delay time.

The foregoing and other objects, features and advantages of the invention will become more readily apparent from the following detailed description of a preferred embodiment that proceeds with reference to the drawings.

DETAILED DESCRIPTION OF A PREFERRED EMBODIMENT

Figure 1:
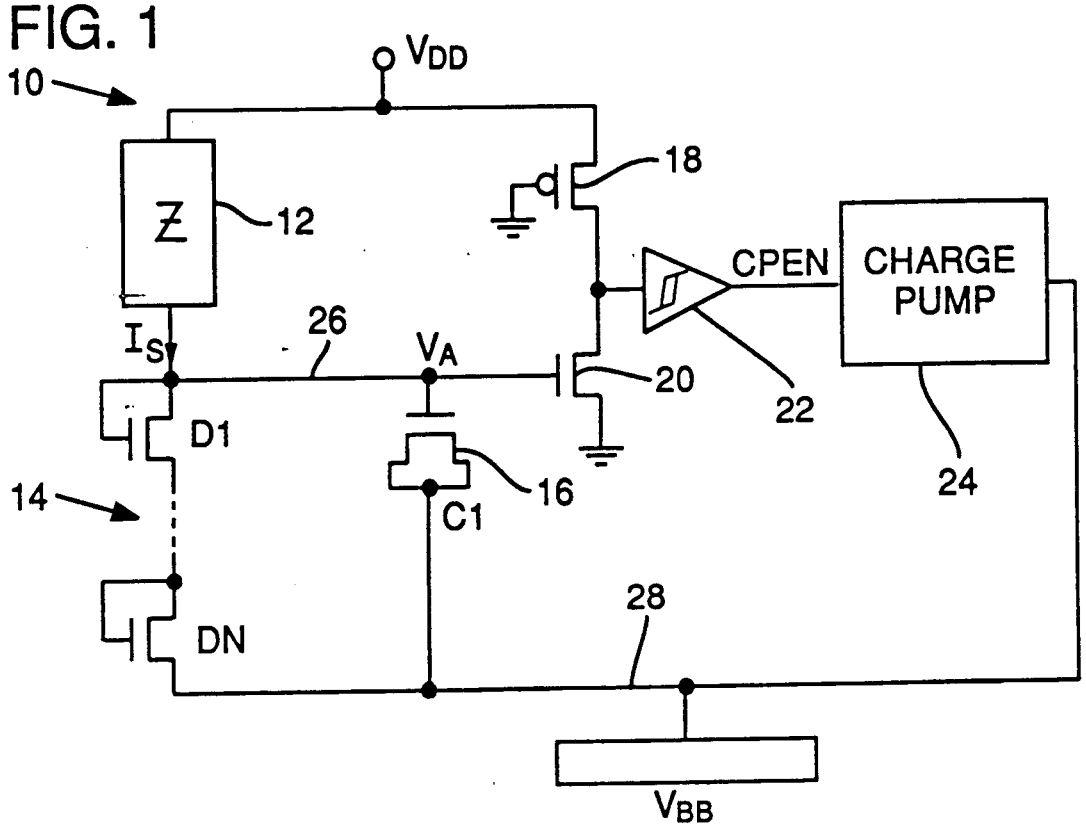
FIG. 1 is a schematic diagram of a substrate bias generator circuit according to the present invention for maintaining the substrate voltage of a P-type substrate or well.

Referring now to FIG. 1, a low current substrate bias generator 10 for regulating the voltage $V_{BB}$ of a substrate layer of an integrated circuit according to the present invention includes a bias output node 28 for coupling to the substrate layer or well. The bias output node 28 also serves as the input to a sense circuit that includes a load element 12 and a level shifting circuit 14 that are coupled together at an intermediate node 26. The voltage on the intermediate node 26 is designated $V_A$. The load element 12 is coupled between the intermediate node 26 and the positive five volt supply voltage source, $V_{DD}$. The level shifting circuit 14 is coupled between the intermediate node 26 and the bias output node 28. A capacitor 16 having a value of C1 is also coupled between the intermediate node 26 and the bias output node 28. An inverter 18, 20 includes an N-channel input switching FET 20 and a P-channel load FET 18. The input of the inverter 18, 20 is coupled to the intermediate node 26. The output of the inverter 18, 20 is coupled to a hysteresis circuit element 22 such as a buffer amplifier, inverter, or the like. A charge pump 24 has an input coupled to the output of the hysteresis circuit element 22 and an output coupled to the bias output node 28.

In operation, the bias generator 10 regulates the substrate voltage $V_{BB}$ to a voltage between 0 and −2 volts. A typical nominal level for the substrate voltage $V_{BB}$ is −1.2 volts, but the actual level depends on the design of the integrated circuit. The number and size of diodes D1 through DN of the level shifting circuit 14 are selected such that switching FET 20 is just barely off if the substrate voltage is at the nominal level. If the nominal substrate voltage changes to a more positive level such as −0.8 volts due to the change in operating status or environmental conditions of the integrated circuit, a portion of this change is directly coupled to the intermediate node 26 via capacitor 16. Thus, the inverter 18, 20 changes state and a logic zero is presented to the hysteresis circuit element 22. A control signal CPEN (charge pump enable) is provided at the output of the hysteresis circuit element 22 that turns on the charge pump 24 to restore the nominal substrate voltage. Once the substrate voltage $V_{BB}$ is restored to the nominal level, the voltage $V_A$ on intermediate node 26 returns to a level just below the switching threshold of the inverter 18, 20. The inverter 18, 20 and control signal CPEN change state and the charge pump is turned off.

Figure 2:
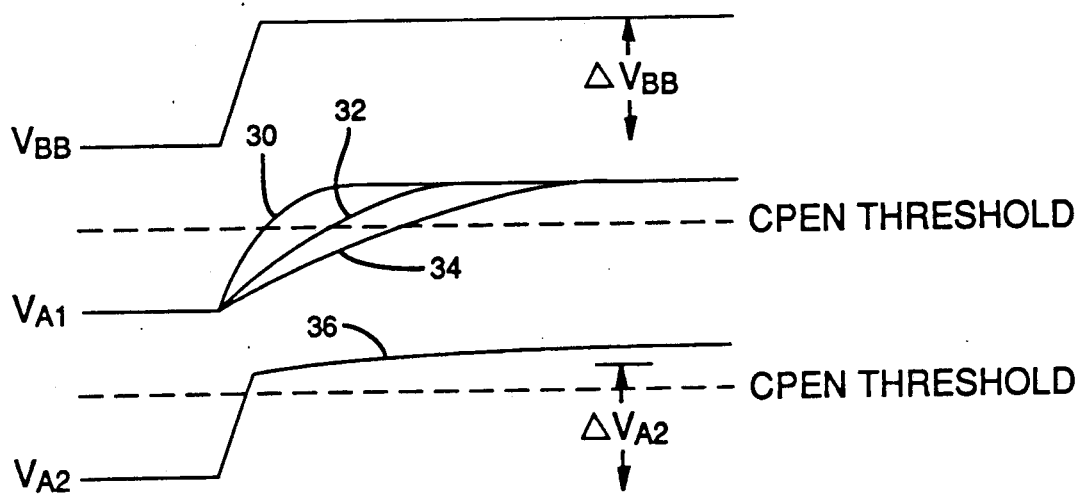
FIG. 2 is a timing diagram illustrating the time response of the substrate bias generator of the present invention.

The time response of the bias generator 10 is shown in FIG. 2. The substrate voltage $V_{BB}$ is shown as a step $\Delta V_{BB}$ from a nominal voltage to a voltage sufficient to change the logic state of the inverter 18, 20 and to turn on the charge pump 24. The voltage $V_{A1}$ at intermediate node 26 represents the voltage response without capacitor 16 for three different values of impedance 12. Due to the parasitic capacitance at intermediate node 26, a low value of impedance 12 produces a short time constant and a quick response as shown in waveform 30. A higher value of impedance 12 produces a longer time constant and a slower response as shown in waveform 32. A still higher value of impedance 12, while significantly decreasing the value of the standing current $I_S$, produces a still longer time constant and a much slower response as shown in waveform 34. The dashed line labeled CPEN THRESHOLD represents the level at which the inverter 18, 20 switches and turns on the charge pump 24. Note that the delay time progressively increases in waveforms 30–34 as the value of the impedance 12 increases.

The voltage $V_{A2}$ at intermediate node 26 represents the voltage response including capacitor 16 for an extremely high value of impedance 12 and a correspondingly low value of $I_S$. Since the voltage across capacitor 16 cannot be changed instantaneously, changes in the substrate voltage $V_{BB}$ are directly coupled from the input 28 to the output 26 of the sense circuit 12, 14. Note that there is no increase in the delay time, although $V_{A2}$ increases slowly after the CPEN THRESHOLD is crossed. The increase due to the long time constant is shown in waveform portion 36. The slope of $\Delta V_{A2}$ and time at which $V_{A2}$ crosses the CPEN THRESHOLD is determined primarily by the slope of $\Delta V_{BB}$. However, the magnitude of $\Delta V_{A2}$ is not exactly equal to $\Delta V_{BB}$.

Figure 3:
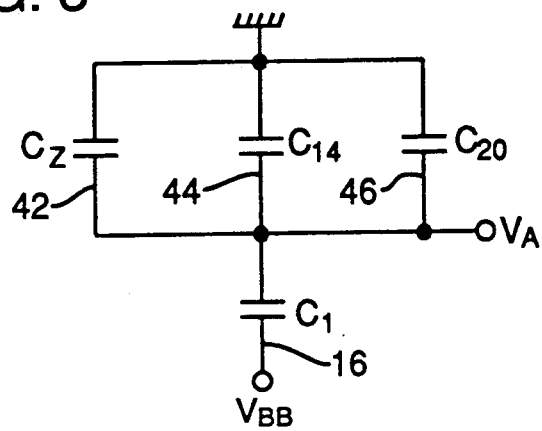
FIG. 3 is a schematic diagram showing charge sharing of changes in the substrate voltage.

FIG. 3 shows the charge sharing of the substrate voltage $V_{BB}$. The voltage on capacitor 16 having a value of C1 cannot be changed instantaneously, but the charge on capacitor 16 must be shared with the parasitic capacitors 42, 44, and 46 designated $C_Z$, $C_{14}$, and $C_{20}$, respectively. Parasitic capacitors 42, 44, and 46 represent the parasitic capacitance of the load element 12, the level shifting circuit 14, and the input to the switching FET 20. If the total parasitic capacitance has a value of CS, then the magnitude of the change in $V_{A2}$ is given by:

$$\Delta V_{A2} = \Delta V_{BB} \times (C1/(C1 + CS)).$$

For example, if the total parasitic capacitance has a value of 0.2 pf and the value of capacitor 16 is 1.8 pf, then 90% of the change in substrate voltage is coupled to intermediate node 26.

Referring back to FIG. 1, the sense circuit including load element 12 and level shifting circuit 14 has a predetermined standing current $I_S$ that flows directly into the substrate. The current requirement of the bias generator 10 is reduced by increasing the value of the load element 12 and a reasonable delay time is maintained by coupling a capacitor 16 across the level shifting circuit 14. For a significant reduction in the current requirements of bias generator 10, the value of the load element 12 can exceed 10 Megohms. Therefore, the current flowing through load element 12 can be less than the typical 5 μA. A reduced current flow of 1 μA or less may easily be achieved. Theoretically, the current flowing the sense circuit 12, 14 can be as low as several tens of picoamps. A high value of resistance for load element 12 is possible by using a lightly doped polysilicon resistor, an undoped polysilicon resistor, a serpentine N-type well in a P-type substrate, a serpentine P-type well in an N-type substrate or the drain-to-source resistance of an appropriately sized FET.

The level shifting circuit 14 includes a plurality of serially-connected diodes D1 through DN. The diodes D1 through DN can be diode-connected P-channel FETs, diode-connected N-channel FETs, or a combination of the two. Similarly, the capacitor 16 can be a P-channel or N-channel FET wherein the gate forms a first plate of the capacitor, and the coupled source and drain forms the second plate of the capacitor. To provide a change in the voltage $\Delta V_A$ that is approximately equal to the change in the substrate voltage $\Delta V_{BB}$, it is desirable that the capacitor 16 be selected to be between five and ten times the combined parasitic capacitance CS of the load element 12, level shifting circuit 14, and switching FET 20. For example, if the total parasitic capacitance has a value of 0.2 pf, it is desirable that capacitor 16 be selected to be between 1 pf and 2 pf.

As is known in the art, it is desirable to add hysteresis to the switching of the inverter 18, 20 in order that the charge pump is not excessively cycled. Therefore, a hysteresis circuit element 22 such as an inverter, buffer amplifier or the like can be inserted between the output of the inverter 18, 20 and the input of the charge pump 24. Alternatively, the inverter 18, 20 can be configured to include a hysteresis switching-threshold. It is also desirable that the switching FET 20 and the load FET be sized for high gain such that a small change at the input switches the inverter. Therefore, the size of the input switching FET 20 can be at least ten times the size of the load FET 18.

Figure 4:
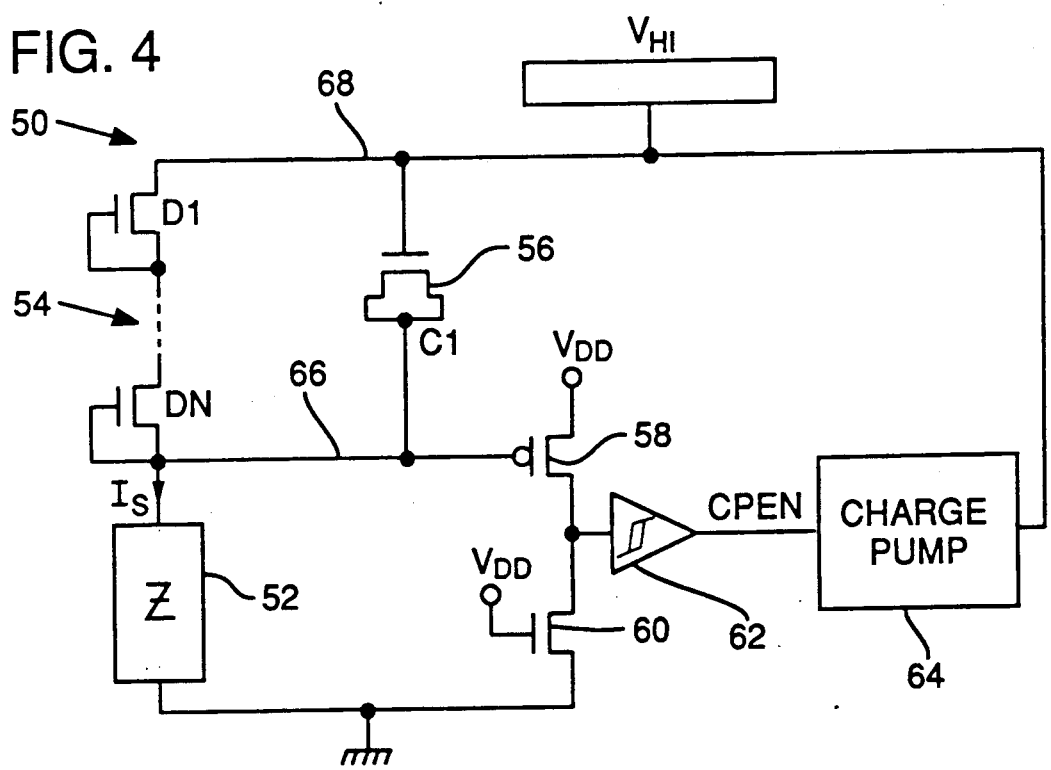
FIG. 4 is a schematic diagram of a substrate bias generator circuit according to the present invention for maintaining the substrate voltage of an N-type substrate or well.

If an integrated circuit is built on an N-type substrate or contains N-type wells, performance is enhanced by generating a bias voltage that is greater than $V_{DD}$. Referring now to FIG. 4, a low current substrate bias generator 50 for regulating the voltage $V_{HI}$ of a substrate layer of an integrated circuit containing an N-type substrate or well includes a bias output node 68 for coupling to the substrate layer or well. The bias output node 68 also serves as the input to a sense circuit that includes a load element 52 and a level shifting circuit 54 that are coupled together at an intermediate node 66. The voltage on the intermediate node 66 is designated $V_A$. The load element 52 is coupled between the intermediate node 66 and ground. The level shifting circuit 54 is coupled between the intermediate node 26 and the bias output node 68. A capacitor 16 having a value of C1 is also coupled between the intermediate node 66 and the bias output node 68. An inverter 58, 60 includes a P-channel input switching FET 58 and an N-channel load FET 60. The input of the inverter 58, 60 is coupled to the intermediate node 66. The output of the inverter 58, 60 is coupled to a hysteresis circuit element 62 such as a buffer amplifier, inverter, or the like. A charge pump 64 has an input coupled to the output of the hysteresis circuit element 62 and an output coupled to the bias output node 68.

In operation, the operation of bias generator 50 is similar to that of bias generator 10 described above with the exception that the charge pump 64 must be designed to provide a voltage $V_{HI}$ that is greater than $V_{DD}$. In both bias generator 10 and 50 it is desirable that the termination of capacitor 16, 56 and level shifting circuit 14, 54 at the bias output node 28, 68 be physically located as close as is possible on the integrated circuit. This is especially important in highly resistive substrates.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A low current substrate bias generator for regulating the magnitude of the nominal voltage of a substrate layer in an integrated circuit comprising:
   a bias output node for coupling to the substrate layer;
   an intermediate node;
   a load element coupled between the intermediate node and a source of supply voltage;
   a level shifting circuit coupled between the intermediate node and the bias output node;
   an inverter having an input and an output, the input being coupled to the intermediate node;
   a charge pump having an input coupled to the output of the inverter and an output coupled to the bias output node; and
   a capacitor coupled between the intermediate node and the bias output node for directly coupling changes in the voltage of the substrate layer to the intermediate node sufficient to turn on the charge pump and return the voltage of the substrate layer to the nominal value.

2. A low current substrate bias generator as in claim 1 in which the value of the load element exceeds 10 Megohms.

3. A low current substrate bias generator as in claim 2 in which the load element comprises a lightly doped polysilicon resistor.

4. A low current substrate bias generator as in claim 2 in which the load element comprises an undoped polysilicon resistor.

5. A low current substrate bias generator as in claim 2 in which the substrate of the integrated circuit is P-type and the load element comprises a serpentine N-type well.

6. A low current substrate bias generator as in claim 2 in which the substrate of the integrated circuit is N-type and the load element comprises a serpentine P-type well.

7. A low current substrate bias generator as in claim 2 in which the load element comprises the drain-to-source resistance of an FET.

8. A low current substrate bias generator as in claim 1 in which the level shifting circuit comprises a plurality of serially-connected diodes.

9. A low current substrate bias generator as in claim 8 in which at least one of the level shifting diodes is a diode-connected P-channel FET.

10. A low current substrate bias generator as in claim 8 in which at least one of the level shifting diodes is a diode-connected N-channel FET.

11. A low current substrate bias generator as in claim 1 in which the capacitor comprises an FET having a gate, a source, and a drain, the gate forming a first plate of the capacitor, and the coupled source and drain forming a second plate of the capacitor.

12. A low current substrate bias generator as in claim 1 in which the value of the capacitor is between five and ten times a combined parasitic capacitance of the load element, level shifting circuit, and inverter input.

13. A low current substrate bias generator as in claim 1 further comprising a hysteresis circuit element interposed between the output of the inverter and the input of the charge pump.

14. A low current substrate bias generator as in claim 1 in which the inverter comprises a hysteresis switching-threshold inverter.

15. A low current substrate bias generator as in claim 1 in which the inverter comprises an input switching FET coupled to a load FET, the size of the input switching FET being at least ten times the size of the load FET.

16. A low current substrate bias generator as in claim 1 in which the value of the source of supply voltage is a predetermined positive value and the value of a bias voltage at the bias output node is greater than the predetermined positive value.

17. A low current substrate bias generator as in claim 1 in which the value of the source of supply voltage is substantially equal to ground and the value of a bias voltage at the bias output node is less than ground.

18. In a substrate bias generator for regulating the magnitude of the nominal voltage of a substrate layer in an integrated circuit, the bias generator having a nominal current requirement and including a bias output node for coupling to the substrate layer, an intermediate node, a load element coupled between the intermediate node and a source of supply voltage, a level shifting circuit coupled between the intermediate node and the bias output node, charge pump means having an input coupled to the intermediate node and an output coupled to the bias output node, a method for reducing the current requirement of the bias generator while maintaining the regulation of the substrate layer voltage, the method comprising:
   capacitively coupling the voltage at the bias output node to the intermediate node to turn on the charge pump means and restore the nominal substrate voltage; and
   selecting the value of the load element such that the current flowing through the load element is less than $5\mu A$.

19. A method for reducing the current requirement of the bias generator as in claim 18 in which the step of capacitively coupling the voltage at the bias output node to the intermediate node comprises coupling a capacitor between the bias output terminal and the intermediate node.

20. A method for reducing the current requirement of the bias generator as in claim 19 in which the value of the capacitor is sized to be between five and ten times the value of a total parasitic capacitance associated with the intermediate node.

* * * * *